United States Patent [19]

Chin et al.

[11] Patent Number: 4,922,455
[45] Date of Patent: May 1, 1990

[54] MEMORY CELL WITH ACTIVE DEVICE FOR SATURATION CAPACITANCE DISCHARGE PRIOR TO WRITING

[75] Inventors: William B. Chin, Wappingers Falls; Rudolph D. Dussault, Hopewell Junction; Ronald W. Knepper, Lagrangeville, all of N.Y.; Friedrich C. Wernicke, Schoenaich, Fed. Rep. of Germany; Robert C. Wong, Poughkeepsie, N.Y.

[73] Assignee: International Business Machines Corporation, Armonk, N.Y.

[21] Appl. No.: 94,465

[22] Filed: Sep. 8, 1987

[51] Int. Cl.$^5$ .............................................. G11C 11/00
[52] U.S. Cl. .................................. 365/154; 365/175; 365/189.06; 365/204
[58] Field of Search ............... 365/189, 155, 154, 203, 365/179, 175, 156, 204; 369/189.06

[56] References Cited

U.S. PATENT DOCUMENTS

| | | | |
|---|---|---|---|
| 3,510,849 | 5/1970 | Igarashi | 365/154 X |
| 3,585,412 | 6/1971 | Hodges et al. | 307/303 |
| 3,671,772 | 6/1972 | Henle | 365/154 X |
| 3,703,709 | 11/1972 | Matsue | 340/173 FF |
| 3,849,675 | 11/1974 | Waaben | 307/292 |
| 3,969,707 | 7/1976 | Lane et al. | 340/173 AM |
| 3,973,246 | 8/1976 | Millhollan et al. | 340/173 FF |
| 4,023,148 | 5/1977 | Hueber et al. | 340/173 R |
| 4,057,789 | 11/1977 | Spadavecchia et al. | 365/189 |
| 4,090,255 | 5/1978 | Berger et al. | 365/154 |
| 4,127,899 | 11/1978 | Dachtera | 365/154 |
| 4,308,595 | 12/1981 | Houghton | 365/203 |
| 4,393,471 | 7/1983 | Hart et al. | 365/154 |
| 4,400,712 | 8/1983 | O'Connor | 357/44 |
| 4,439,842 | 3/1984 | Malaviya | 365/104 |
| 4,479,200 | 10/1984 | Sato et al. | 365/175 |
| 4,480,319 | 10/1984 | Hotta et al. | 365/156 X |
| 4,538,244 | 8/1985 | Sugo et al. | 365/155 |
| 4,575,821 | 3/1986 | Eden et al. | 365/154 |
| 4,592,023 | 5/1986 | Beranger et al. | 365/189 |
| 4,598,390 | 7/1986 | Chan | 365/230 |
| 4,635,228 | 1/1987 | Jordy | 365/156 X |

FOREIGN PATENT DOCUMENTS 0147889 9/1983 Japan .................................. 365/175

OTHER PUBLICATIONS

IBM Technical Disclosure Bulletin, vol. 22, No. 1, Jun. 1979, Denis et al., Random-Access Memory Cell for Medium Performance Applications.
IBM Technical Disclosure Bulletin, vol. 13, No. 2, Jul. 1970, Shepard et al., FET Memory Cell Using Schottky Diodes as Load Devices.
IBM TDB, vol. 28, No. 8, Jan. 1986, pp. 3350-3351, Kneeper et al.
Kolchak, IBM TDB, vol. 17, No. 4, 9/74, pp. 1058-1059.
Eardley-IBM TDB, vol. 21, No. 11, Apr. 1979, pp. 4529-4530.

*Primary Examiner*—Stuart N. Hecker
*Assistant Examiner*—Andrew P. Sniezek
*Attorney, Agent, or Firm*—W. T. Ellis; R. J. Haase; Otho B. Ross, III

[57] ABSTRACT

A transistor memory cell is disclosed of the type wherein an unclamped conducting transistor in each of a plurality of memory cells connected to a given word line is driven into saturation when storing data. The cell is equipped with controlled active devices for discharging the saturation capacitance of the conducting transistors prior to writing new data into the cells. Each active device is characterized with a forward low-impedance current direction and reverse high impedance current direction therethrough for each saturation transistor. Each active device is connected to discharge an associated saturation transistor in its forward current direction. In one embodiment, each active device discharges to a word line when the line is brought to an appropriate control potential. In another embodiment, each active device discharges to a separate discharge line not connected to the work line when the former line is brought to an appropriate control potential. The active devices may be diodes. In yet a further embodiment, the active devices may comprise diodes with leaky reverse bias characteristics. These diodes, in their reverse bias current direction, may be used as the memory cell loads. Alternatively, a PNP transistor may be used as the memory cell load. Resistors may be included in the discharge line to prevent word line-bit line voltage clamping.

19 Claims, 3 Drawing Sheets

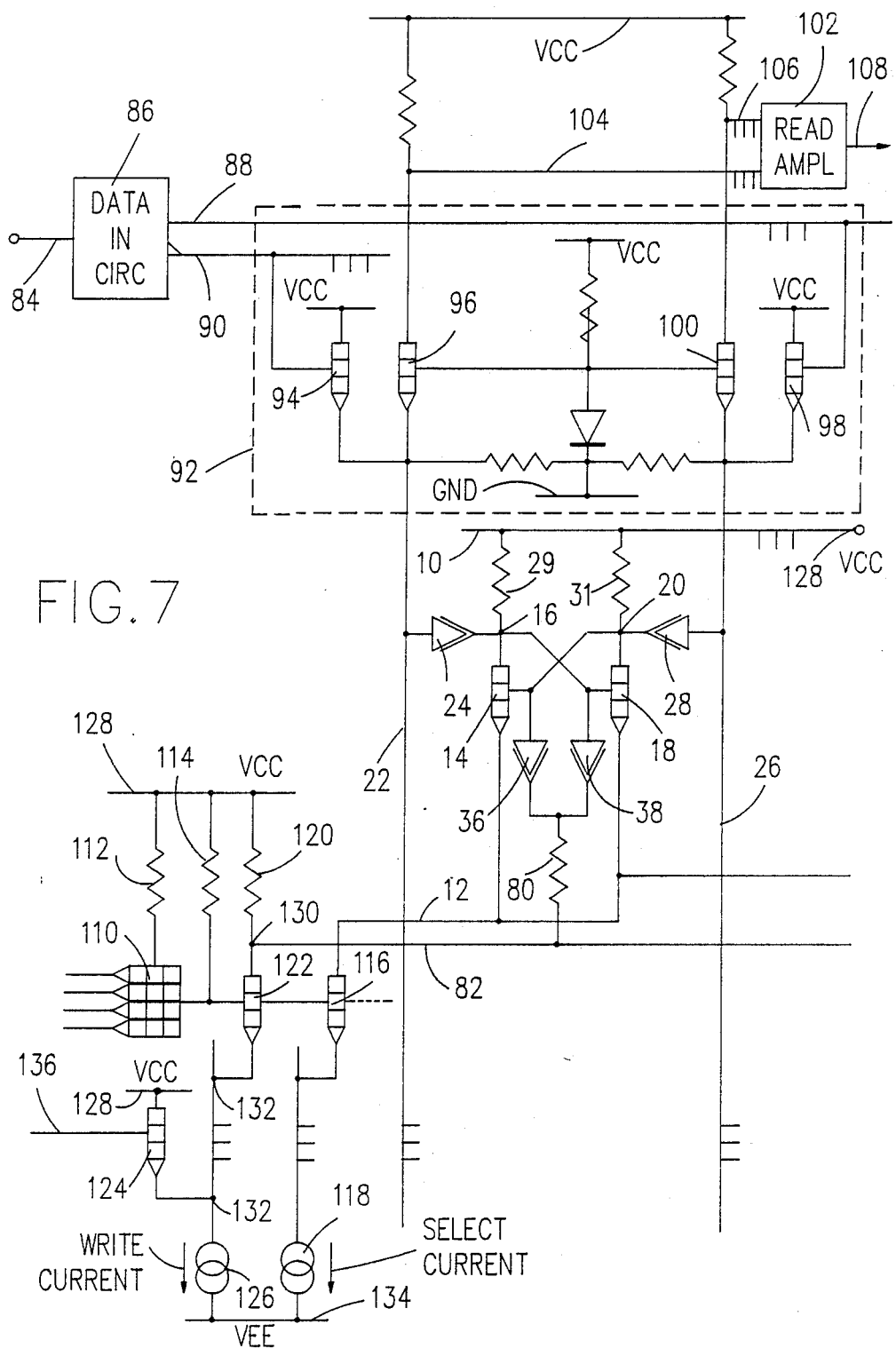

MEMORY CELL WITH ACTIVE DEVICE FOR SATURATION CAPACITANCE DISCHARGE PRIOR TO WRITING

BACKGROUND OF THE INVENTION

The present invention relates generally to memory cell arrays, and more particularly to memory cell arrays that use conducting transistors in saturation to write data.

As memory cells are reduced in size with each new generation, soft errors caused, for example, by alpha particles or cosmic rays, become a major concern. One method of providing high soft error immunity is to operate the memory cells in transistor saturation. However, in order to write data into such memory cells, the saturation capacitance in the memory cell transistors must first be discharged. In the prior art, such a capacitive transistor-saturation discharge is achieved by means of increased power and/or delay. Typically, the new data signals themselves are used to overcome this saturation. This discharging requirement thus places a lower limit on the word line voltages that may be used and increases the write times for the cells.

The word line voltage limitation is particularly acute for Schottky-coupled memory cells operating in deep saturation. In this regard, in order to guarantee that the coupling Schottky diodes for an unselected memory cell do not conduct, the lower word line used in such cells must be set at a predetermined voltage level. However, for deep saturation operation a significant part of the total cell current flows through the load resistor connected to the base of the saturated conducting transistor. Accordingly, the voltage drop across the cell (the drop across that load resistor plus the Vbe for the conducting transistor) is relatively high. Thus, the upper word line for the cell must be set at a comparable level. The result of the above is that the standby current through the memory cell when it is not selected (the current flowing through the load resistors) is on the order of 60 $\mu$A. The total standby current on a given upper word line is this memory cell standby current multiplied by the number of cells on that word line. In order to draw such a word line standby current while maintaining the word line voltage level requires that the power supply connection to the upper word line utilize only a small valued resistor therein. However, such a small value resistor directly impacts the WRITE time for the circuit and causes a significantly increased power dissipation for the array. The resulting current sinking requirements placed on adjacent circuits (decoders, etc.) cause cell-to-cell voltage variations, with attendant cell WRITE time variations.

The invention as claimed is intended to remedy the above-described WRITE time and power dissipation problems in saturated memory cell configurations.

SUMMARY OF THE INVENTION

Briefly, the present invention is designed for a transistor memory cell array of the type wherein an unclamped conducting transistor in each of a plurality of memory cells connected to a given word line is driven into saturation when storing data for its respective cell. The improvement in this cell array is characterized as means in each memory cell for discharging the saturation of the conducting transistor therein prior to writing new data into the cell, the means including an active device with a forward low-impedance current direction and a reverse high-impedance current direction therethrough, for discharging the conducting transistor in the forward current direction therethrough.

In one embodiment of the present invention, the means for discharging comprises means for discharging the saturation capacitance of the conducting transistor in the forward current direction through the active device to a given word line. The discharging means further comprises means for applying potentials to the given word line to cause conduction of current in the forward current direction through the active device prior to writing new data into each cell, and to cause non-conduction of the active device in the forward current direction at other times.

In one embodiment, this active device may be a diode connected between the given word line and the current-collecting terminal of the conducting transistor.

In a further embodiment of the present invention, the memory cell array may comprise a discharge line, separate from the given word line, for discharging the conducting transistor saturation capacitance for a plurality of the memory cells, with the active devices in the discharging means associated with the plurality of memory cells discharging their associated transistors in the forward current direction to the discharge line. In this embodiment, means are included for applying potentials to the discharge line to cause the conduction of current in the forward current direction of the active devices prior to writing new data into each cell, and to cause non-conduction in the forward current direction of the active devices at other times. In one embodiment, the discharging means comprises a current path between the current-collecting terminal of each transistor driven into saturation and the discharge line, with the current path including a diode therein connected with its forward bias current direction being toward the discharge line. This current path may include resistance means for providing resistance therein.

In a further embodiment of the present invention, the load for each of the saturation transistors may be provided by a resistive second current path connected between the current-collecting terminal of each of the saturation transistors and the given word line. In the alternative, the load may be provided by a PNP transistor disposed with its emitter connected to the word line, its collector connected to the base of the respective saturation transistor, and with its base connected to the collector of the respective saturation transistor.

In yet a further embodiment of the present invention, diodes used in the discharging means for discharging the capacitance in their forward bias direction may be designed to have a leaky reverse bias characteristic so that they may serve as high-valued load resistors during non-discharge periods. Typically, such resistors will be on the order of 90 k-ohms in value or greater. With such a leaky reverse-bias diode acting as the saturation transistor load, parallel current path loads may be removed. Small resistors may conveniently be included in series with these leaky reverse-bias diodes in the current path in order to prevent word line clamping.

In a preferred embodiment, each memory cell may comprise two saturation transistors with their current emitting terminals coupled to a second word line, and with the control terminal for each saturation transistor coupled to the current-collecting terminal of the other saturation transistor, with one of the transistors conducting in saturation to store data.

BRIEF DESCRIPTION OF THE DRAWINGS

FIG. 7 is a schematic circuit diagram of a sixth embodiment of the present invention utilizing a separate discharge line.

DETAILED DESCRIPTION OF THE PREFERRED EMBODIMENT

The present invention is directed to the problem of significantly decreasing the WRITE times in a memory cell array which utilizes conducting transistors which store data when driven into saturation. This invention is described in the context of bipolar NPN transistors, for convenience of explanation. However, it is clear to one skilled in the art that any other switching device, including PNP transistors and field effect transistors, may be substituted therefor. Additionally, the present invention is explained in the context of a memory cell saturation configuration utilizing cross-coupled transistors. However, it is clear to one skilled in the art that the present invention is not limited to this particular type of saturation transistor coupling, but has applicability to any configuration wherein transistor saturation capacitance must be discharged.

In order to provide some generality of terminology for the claims, the term "control terminal", when used in relation to the transistor, refers to the terminal used for effecting switching of the transistor (the base for bipolar transistors and the gate for field effect transistors). Likewise, the term "current-collecting terminal" is used to refer to the collector for bipolar transistors, and to the drain for field effect transistors. Likewise, the term "current-emitting terminal" refers to the emitter for bipolar transistors and to the source for field effect transistors.

Figure 1:
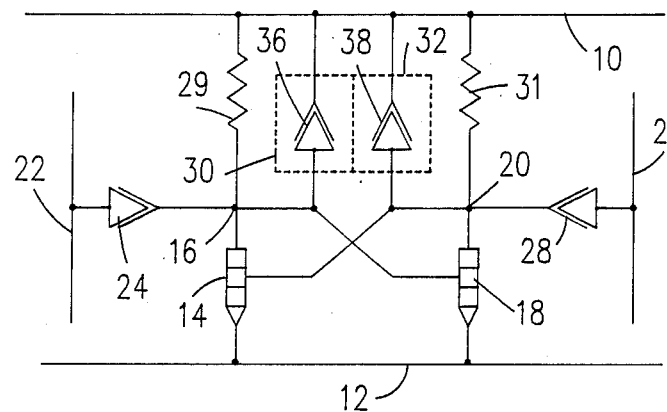
FIG. 1 is a schematic circuit diagram of one embodiment of the present invention.

Referring now to FIG. 1, an example cross-coupled memory cell is shown disposed between an upper word line 10 and a lower word line 12. This cross-coupled memory cell comprises a transistor 14 with its emitter connected to the lower word line 12 and with its collector connected to a node 16. The cell further includes a transistor 18 with its emitter connected to the lower word line 12 and with its collector connected to a node 20. The transistors 14 and 18 are cross-coupled by connecting the base terminal for transistor 14 to the node 20 collector terminal for the transistor 18, while connecting the base terminal for the transistor 18 to the node 16 collector terminal for the transistor 14. These cross-coupled transistors 14 and 18 are unclamped, i.e., there is no diode disposed across the collector and base terminals of the transistors to clamp the voltage thereacross. Accordingly, these transistors are readily driven into saturation when conducting.

The circuit shown in FIG. 1 further includes some form of load resistance connected between the upper word line 10 and the collectors of the respective saturation transistors 14 and 18. In the Figure, this load resistance for the saturation transistor 14 is realized by a resistor 29 connected between the word line 10 and the collector of the transistor 14. Likewise, the load resistance for the saturation transistor 18 is realized by a resistor 31 connected between the word line 10 and the collector of the transistor 18. Note that the resistors 29 and 31 are typically large in order to obtain the required I.R. voltage drop for the memory cell and to effect transistor saturation. As the memory cell currents are decreased with each succeeding generation of memories, these load resistors 29 and 31 must accordingly increase to maintain this I.R. drop. Thus, the saturation capacitance discharge through these load resistors 29 and 31 tends to be very inefficient.

Typically, the cross-coupled memory cell shown in FIG. 1 is connected to a set of bit lines. In the Figure, a left bit line 22 is connected through an isolation diode 24 to the node 16. Likewise, a right bit line 26 is connected via an isolation diode 28 to the node 20. In this configuration, the isolation diodes 24 and 28, which are utilized to isolate the individual memory cell from the other memory cells in the array, may conveniently be implemented by Schottky barrier diodes with their anodes connected to their associated bit lines, and with their cathodes connected to the collectors of their associated saturation transistors.

The present invention includes means for discharging the saturation capacitance of whichever of the transistors 14 or 18 is conducting, prior to writing new data into the individual memory cells. In the embodiment shown in FIG. 1, this discharging means includes means 30 and 32 for forming a current path from the collectors of the respective transistors 14 and 18, to the upper word line 10. Means 30 includes an active device 36 with a forward low-impedance current direction and a reverse-high impedance current direction therethrough, for discharging an associated conducting transistor 14 in the forward current direction therethrough. Likewise, means 32 includes an active device 38 with a forward low-impedance current direction and a reverse high-impedance current direction therethrough, for discharging an associated conducting transistor 18 in the forward direction therethrough to the word line 10. By way of example, these active devices 36 and 38 may be realized by diodes, with their respective anodes connected to the collectors of their associated transistors, and with their cathodes connected to the word line 10. These diodes 36 and 38 may be conveniently realized by Schottky barrier diodes.

Means are provided for applying potentials to the upper word line 10 to cause conduction of these active devices 36 and 38 in the forward current direction therethrough prior to writing new data into each memory cell, and to cause non-conduction of the active devices 36 and 38 in their forward current direction at other times. This application of potentials to the word line 10 may be accomplished by any of a number of standard clocking sequences.

Accordingly, it can be seen that during standby operation or read-access operation, there is no current flow through the active devices 36 and 38 in their forward-current direction. However, during the discharge operation which occurs prior to data write-in, the voltage on the upper word line 10 is dropped to a low level to cause the active devices 36 and 38 to become biased in their forward current direction. Accordingly, the active devices 36 and 38 turn on and conduct current from the collectors of their respective transistors 14 and 18 to discharge the saturation capacitance in whichever of those transistors is conducting. It should be noted that this saturation discharge also occurs partially through the parallel load resistors 29 and 31. Note that it is preferred that the upper word line 10 be pulled down first prior to a voltage pull up of the bit lines 22 or 26, to avoid the voltage clamping of the upper word line 10 by one of these bit lines. This clamping would occur due to the fixed voltage drop, for example, from the bit line 22 through the diode 24 and the diode 36 to the word line 10.

Figure 2:
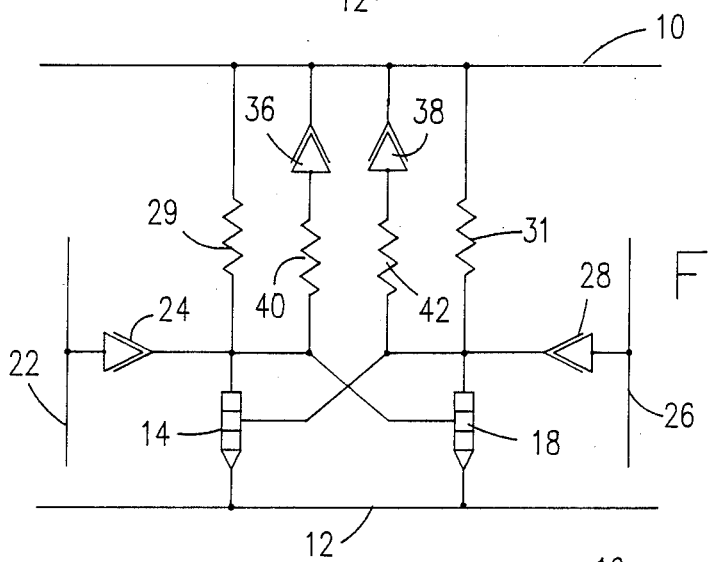
FIG. 2 is a schematic circuit diagram of a second embodiment of the second invention.

It should be noted that the timing requirement, i.e., that the upper word line 10 be pulled down in voltage prior to any bit line voltage pull up in order to avoid word line clamping by the bit lines, may be relaxed if additional resistors are added in series with the active devices 36 and 38. These resistors may be disposed anywhere in the series circuit from the cathodes of the respective bit line isolation diodes through the respective active devices to the upper word line 10. For example, a resistor could be inserted in the current path from the cathode of the diode 24 through the active device 36 to the word line 10. Likewise, a resistor could be inserted in the current path from the cathode of the diode 28 through the diode 38 to the word line 10. These added resistors may be small in value and function to provide a sufficient voltage drop to maintain the voltage on the upper word line 10 after one of the bit lines has been pulled up in voltage. These added resistors are illustrated in FIG. 2 by the resistors 40 and 42. The resistor 40 is connected in series between the anode of the diode 36 and the cathode of the diode 24. The resistor 42 is connected in series between the anode of the diode 38 and the cathode of the diode 28. The exact resistance values for the resistors 40 and 42 are not critical. However, the resistance value for these resistors should be significantly less than the load resistors 29 and 31. These resistors 40 and 42 may be implemented by polysilicon resistors realized simply by extending the saturation transistor base which is connected to that discharge current path, i.e., by extending the base for transistor 18 to form the resistor 40, and by extending the base for transistor 14 to form the resistor 42. Note that the resistors 40 and 42 for all of the memory cells on the same upper word line 10 can then be integrated on the same base subdiffusion bed. Note also that if P-type Schottky barrier diodes are utilized for the diodes 36 and 38, then the memory cell size can be further optimized by integrating these P-type diodes and their resistors 40 and 42 with the polysilicon base diffusion for the saturation transistors 14 and 18. In the alternative, it may be desirable to integrate the resistors 40 and 42 with the diodes 36 and 38, i.e., tailor the Schottky barrier diode resistance as the discharge resistors 40 and 42.

Figure 3:
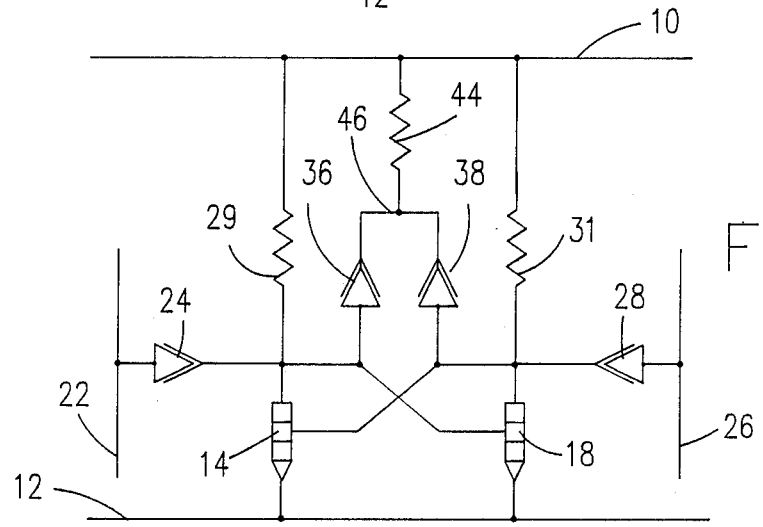
FIG. 3 is a schematic circuit diagram of a third embodiment of the present invention.

The additional resistance added to prevent upper word line 10 clamping by the bit lines may also be implemented by a single resistor 44 connected as shown in FIG. 3. In this embodiment, the diodes 36 and 38 are connected at their cathodes to a node 46. The additional resistor 44 is then connected between the upper word line 10 and this node 46. This resistor 44 may be conveniently implemented by a resistor formed in diodes 36 and 38 and the upper word line 10. Accordingly, the reach-through between the cathodes for diodes 36 and 38 and the upper word line 10 can be omitted.

It should be noted that in order to obtain a further improvement in soft error immunity, saturation transistors 14 and 18 can be inverted in the circuit.

Figure 4:
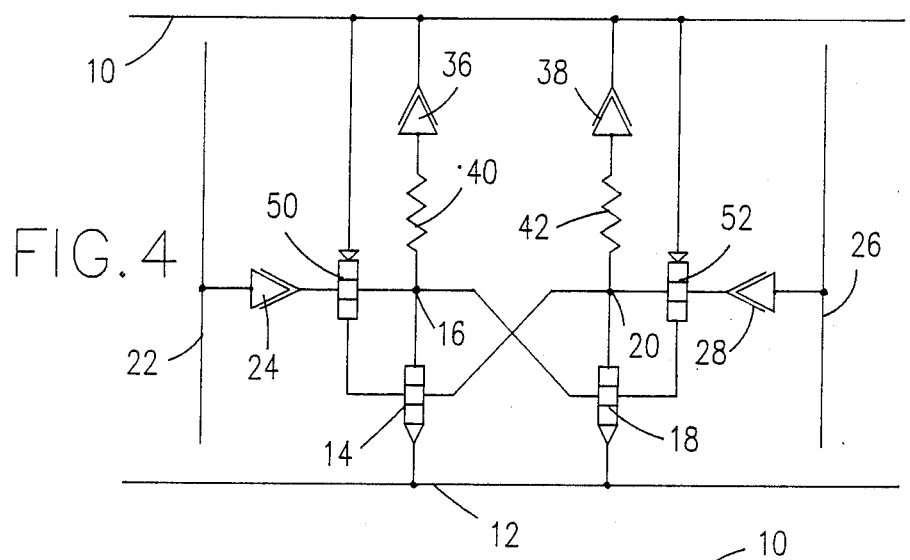
FIG. 4 is a schematic circuit diagram of a fourth embodiment of the present invention.

FIG. 4 sets forth a further embodiment of the present invention. In this regard, it is known that for saturation memory cells, the cell current must be sufficiently high to sustain saturation at reasonable pull up resistances (e.g., cell currents should typically be greater than 60 micro amps at a pull up resistance of 24 k-ohms). Additionally, the size of the typical saturation memory cells is generally large, (greater than 12002 micrometers) and is not extendable to higher density applications. In order to reduce the above-described cell current requirement and the memory cell size, a transistor load is utilized in place of the resistor loads 29 and 31 shown in FIG. 1. In a preferred embodiment, the transistor loads may be implemented by PNP transistors 50 and 52. In particular, the PNP transistor 50 is disposed with its emitter connected to the upper word line 10, with its collector connected to the base of the saturation transistor 14, and with its base connected to the collector node 16 for the saturation transistor 14. Likewise, the PNP transistor 52 is disposed with its emitter connected to the upper word line 10, with its collector connected to the base of the saturation transistor 18, and with its base connected to the collector node 20 for the saturation transistor 18.

The PNP transistors effectively provide load resistances of on the order of one meg-ohm in a small transistor area. Accordingly, the need for load resistors with large-area diffusions is avoided. (Note that if the load resistance is not large enough to obtain the required I.R. drop for the cell, then the cell current must be increased. This is an unacceptable option.) Also, PNP transistors have a lower minimum current and good operational stability. Thus, these PNP load transistors in combination with the active discharge devices 36 and 38 provide an optimal tradeoff in cell size, write performance, soft error rate, and power dissipation.

Figure 6:
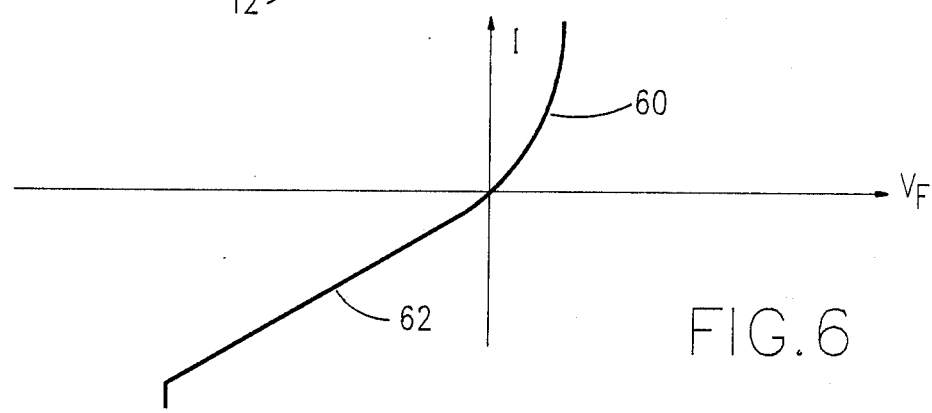
FIG. 6 is a graphical representation of the I-V characteristic for a diode with a leaky reverse-bias characteristic.

In a further embodiment of the present invention, the active devices 36 and 38 are specifically designed to have a leaky reverse-bias characteristic of the type shown in FIG. 6. FIG. 6 is an I-V curve with a standard forward-bias diode characteristic 60 and a leaky reverse-bias characteristic 62. It can be seen that the voltage-current behavior under reverse bias conditions for this device is equivalent to a resistor with a high resistance value. An active device with this type of leaky reverse-bias characteristic may be conveniently realized by means of a specially designed P-type or N-type Schottky barrier diode. The leaky reverse-bias characteristic is obtained, for example, for a P-type Schottky diode simply by implanting a P-type dopant into an N-type substrate with a higher concentration than is normally used to form a diode. Typically, this higher dopant concentration will be on the order of $10^{16}$–$10^{17}$ atoms/cc to obtain the proper leakage. (Note that the resistance decreases as the doping increases.) The actual resistance value obtained for a given Schottky barrier diode are determined empirically. Typical resistance values obtained with such leaky Schottky barrier diodes in a reverse-bias mode are equivalent to 90 k-ohms or greater.

It can be seen that when active devices 36 and 38 are utilized which have the above-described leaky reverse-bias characteristic, they may be utilized in place of the parallel connected high-valued resistors 29 and 31 shown in FIG. 1.

Figure 5:
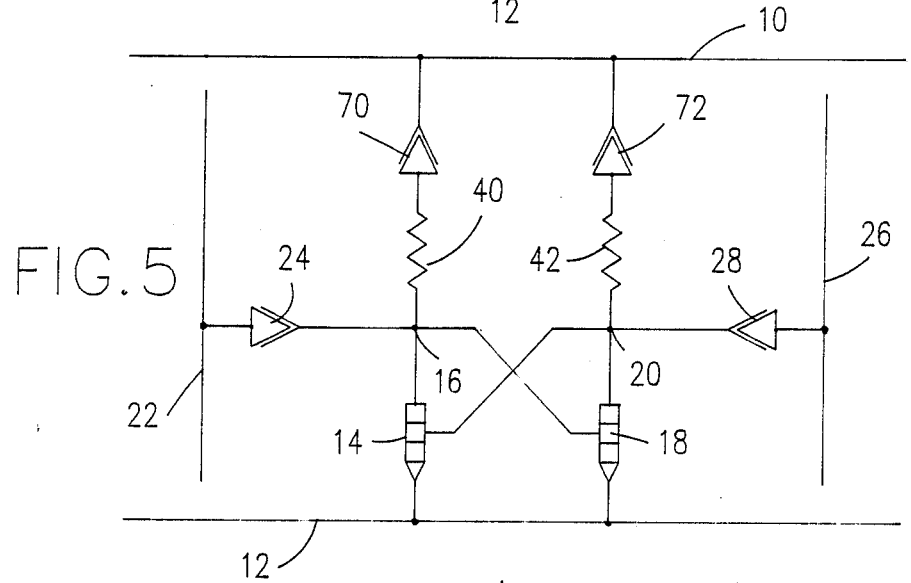
FIG. 5 is a schematic circuit diagram of a fifth embodiment of the present invention utilizing a leaky reverse bias characteristic for its discharge diodes.

FIG. 5 shows an embodiment wherein a set of discharge diodes 70 and 72 have a leaky reverse-bias characteristic so that they act as high-valued load resistors in their reverse-bias condition. Note that FIG. 5 is essentially identical to FIG. 2 except that the load resistors 29 and 31 have been deleted.

In operation of FIG. 5, during the standby mode and during the read-access mode, the upper word line 10 is held at a high voltage relative to the lower word line 12. Accordingly, the diodes 70 and 72 are reverse-biased and act as high-valued load resistors in accordance with the I-V characteristic 62 shown in FIG. 6. During the discharge and write mode, the upper word line 10 is pulled down in voltage to facilitate the saturation capacitance discharge of whichever of the transistors 14 or 16 is conducting and in saturation. Thus, in this mode the diodes 70 and 72 are forward biased and actively discharge the saturated capacitance in order to facilitate a fast write operation. Accordingly, it can be seen that the active devices 70 and 72 in FIG. 5 have a dual function. Under reverse-bias, these diodes function as high-valued load resistors. Under forward-bias, these diodes act to discharge the saturation capacitance in the memory cell.

It should be noted that the use of such leaky reverse-bias diodes with their small respective areas, in place of the large area resistance diffusions provides a significant space savings for the memory cell. Accordingly, the use of such diodes is especially advantageous for high density memory cell arrays.

In the configuration shown in FIG. 5, the leaky reverse-bias diodes 70 and 72 are formed from P-type Schottky barrier diodes. In contrast, the isolation diodes 24 and 28 are formed from N-type Schottky barrier diodes disposed on N-EPI.

FIG. 7 sets forth a sixth embodiment of the present invention, shown in the context of the actual circuitry used to drive the bit lines 22 and 26, and to drive the upper word line 10 and the lower word line 12. In the embodiment of FIG. 7, a saturation memory cell of the type shown in FIG. 3 is disposed between the upper word line 10 and the lower word line 12. However, the resistor 80 connected between the cathodes of the diodes 36 and 38 is not connected to the upper word line 10, but rather is connected to a separate discharge line 82.

The overall embodiment of FIG. 7 includes a standard data-in line 84, which applies data signals to a data-in circuit 86. The data-in circuit 86 provides a true output on line 88 and a complement output on line 90. The true and complement lines 88 and 90 are directed to a circuit 92 for driving the respective bit lines 22 and 26.

The circuitry in block 92 may take a variety of different configurations. In FIG. 7, line 90 is connected to the base input of a transistor 94. The emitter of transistor 94 is connected to switch a bit line transistor 96 into and out of conduction. Accordingly, the value of the voltage on line 90 controls whether or not current is drawn by the bit line 22. Likewise, line 88 is connected to the base of a transistor 98. In turn, the emitter of the transistor 98 is connected to switch a bit line transistor 100 into and out of conduction. Accordingly, the value of the voltage on line 88 controls whether current is drawn by the bit line 26. FIG. 7 further includes a read amplifier 102 with an input line 104 connected to the bit line 22 through bit sense transistor 96, and an input line 106 connected to the bit line 26 through bit sense transistor 100. The read amplifier 102 provides an output signal on line 108 to a data output driver.

FIG. 7 further includes a word decoder, represented by the multi-emitter transistor 110 and the attendant resistors 112 and 114. The collector of the multi-emitter transistor 110 for the word decoder is connected to the base of a select current control transistor 116. The collector of the select current transistor 116 is connected to the lower word line 12, while its emitter is connected to one end of a constant current source 118. The other end of the constant current source 118 is connected to a power supply line 134.

The voltage on the separate discharge line 82 is controlled by a discharge control circuit comprising a resistor 120, a control transistor 122, a write control transistor 124, and a constant current source 126. In the configuration shown in FIG. 7, the resistor 120 is connected between a power supply line 128 and a node 130. The discharge line 82 and the collector of the transistor 122 are also connected to the note 130. The base of the transistor 122 is connected to the collector of the multi-emitter transistor 110. The emitter of the transistor 122 is connected to a node 132. The constant current source 126 is connected between the node 132 and the power supply line 134. The write control transistor 124 is disposed with its collector connected to the power supply line 128, and with its emitter connected to the node 132. A write control line 136 is connected to the base of the write control transistor 124.

In contrast to the circuit of FIG. 7, the circuit of FIG. 3 connects its resistor 44 so that the saturation discharge is applied to the upper word line 10. As previously noted, in order to guarantee that the diodes 24 and 28 of an unselected memory cell are not conducting under worst case conditions, the level of the lower word line 12 is set at a given potential. However, since the transistors 14 and 18 in the memory cell are operated in deep saturation to achieve high alpha-particle immunity, a significant portion of the total cell current flows through the load resistor (29 or 31) connected to the base of whichever of the transistors 14 or 18 is conducting. Thus, the voltage across the memory cell is relatively high, and the memory cell has a high standby current through the cell when it is not selected of on the order of 60 microamps. The total standby current on a given upper word line is the memory cell standby current multiplied by the number of memory cells on that word line. In order to draw such a word line standby current while maintaining the word line voltage level requires that the connection from the power supply 128 to the upper word line 10 include a small value resistor therein. However, such a small value resistor causes a major problem during the discharge cycle. In this regard, in order to quickly remove the charge from the base-collector junction of the conducting transistor (14 or 18) in the memory cell, the voltage on the upper word line 10 in the configuration of FIG. 3 must be lowered to below the voltage on word line 12. However, this low voltage on the upper word line 10 provides a significant voltage drop between the power supply 128 and the line 10, resulting in a large current from the power supply 128 to the line 10. Accordingly, the constant current source for the upper word line will be drawing the majority of its current from the power supply 128, and not through the diodes 36 and 38 and the resistor 44. For example, at a discharge current of approximately 0.5 mA per memory cell, the total required current amounts to 34 mA (assuming 68 cells word-line), of which 20 mA is drawn from the power supply 128 through the small resistor. Thus, this current from the power supply (wasted power) is actually larger than the discharge current from the discharge diodes 36 and 38.

Additionally, the high current drawn through the upper word line 10 increases the load at the delay-sensitive decoder output, and causes a significant voltage line drop along the upper word line 10. This results in variations in the voltages across the various memory cells. This voltage drop variation across the memory cells results in a variation in write times across the memory cells, and the IR drops in the word lines contribute to the power dissipation. This write time variation and power dissipation problem is especially acute if all of the memory sub-arrays are written simultaneously.

In contrast to the operation described for FIG. 3, the operation of FIG. 7, which utilizes the separate discharge line 82, is such that it permits the removal of the small resistance between the power supply 128 and the upper word line 10 and provides an excellent current distribution. More specifically, during the write mode, the saturated cell transistor (14 or 18) is no longer discharged by pulling down the upper word line 10. Instead, a separate discharge line 82 is solely responsible for discharging all cells connected to the word line 10. Since all of the cells are connected to the discharge line 82 via a resistor 80, a very even current distribution between these cells can be sustained in spite of any voltage drop on the discharge line 82. Accordingly, the line width for the discharge line 82 can be made quite small.

It should be noted that the resistor 120 connecting the power supply 128 to the discharge line 82 acts as a pull-up resistor to provide a defined up-level at the discharge line 82 during read and standby modes. The value of the resistor 120 can be chosen to be high (on the order of 2 k-ohms) so that it will divert very little write current away from the cell. Additionally, the voltage drop along the upper word line 10 is now of much less concern since the resistor which connects the power supply 128 to the word line 10 can be significantly reduced in value or this resistor permits an increase in the load resistor values 29 and 31, thereby allowing a higher voltage drop across the individual memory cells. This higher voltage drop across the memory cells further improves the current distribution among all the cells connected to the same word line 10. For the same reason, a higher voltage drop along the lower word line 12 can be tolerated, thereby allowing the width of the lower word line to be decreased. It should be noted that the two word lines 10 and 12 and the discharge line 82 in this new memory cell design can be easily disposed in the same space where previously there had been two word lines, due to the reduction in width permitted for these lines. In the embodiment shown in FIG. 7, the upper word line 10 is connected directly to the power supply line 128. With the upper word line 10 connected to the power supply VCC, it is now possible to raise the standby potential of the lower word line. This is because the voltage value of the upper word line 10 can be shifted up by the removal of the voltage drop from the power supply 128 to the previously included resistor connecting to the upper word line 10. This increase in the minimum voltage for the lower word line 12 improves the functionality of the cell since the outboard Schottky diodes 24 and 28 of an unselected cell cannot turn on in the presence of positive ground shifts and low (defective) forward Schottky junction voltages.

In view of the above, the circuit shown in FIG. 7 improves the write time, improves the write time tolerance, and further improves the power dissipation of the memory cells. Specifically, it permits the voltage on the upper word line 10 to be shifted up, while maintaining the same operating point currents.

While the present invention has been particularly shown and described with reference to preferred embodiments therefor, it will be understood by those skilled in the art that the foregoing and other changes in form and detail may be made therein without departing from the scope and spirit of the present invention.

What is claimed:

1. A transistor memory cell array of the type wherein each of a plurality of memory cells includes data storage transistors connected to a given word line, each of the data storage transistors being driven into saturation thereby charging respective saturation capacitance when storage data, comprising:
    a first word line;
    a second word line;
    each memory cell comprising two unclamped transistors with their current emitting terminals coupled to said second word line and with the control terminal for each transistor coupled to the current-collecting terminal of the other transistor, with one of said transistors conducting in saturation to store data;
    a pair of diodes each having a cathode connected to said first word line and an anode connected to the current-collecting terminal of a respective one of said two transistors, each said diode discharging in its forward bias direction the transistor saturation capacitance associated with the current-collecting terminal of said respective transistor prior to writing new data; and
    means for applying potentials to said first word line to cause the conduction of current in the forward bias direction to said diode prior to writing new data into each cell, and to cause nonconduction in the forward bias direction of said diodes at other times.

2. A memory cell array as defined in claim 1, wherein each of said diodes is disposed in a respective first current path between said first word line and the current-collecting terminal of said respective transistor; and further comprising
    means for providing a resistance in each of said respective first current paths.

3. A memory cell array as defined in claim 2, further comprising a different resistive second current path between said current-collecting terminal for each of said respective transistors and said first word line to provide a load.

4. A memory cell array as defined in claim 1, further comprising a load resistor connected between said current-collecting terminal of each of said respective transistors and said first word line, and in a current path not including said diodes.

5. A memory cell array as defined in claim 1, wherein said diodes are P type Schottky barrier diodes; and further comprising
    a first bit line;
    a first N type Schottky barrier diode for connecting said first bit line to the current-collecting terminals of one of said transistors;

a second bit line; and a second N type Schottky barrier diode for connecting said second bit line to the current-collecting terminal of the other of said transistors.

6. A memory cell array as defined in claim 5, wherein said P type diodes have a leaky reverse bias characteristic which provides an equivalent resistance of at least 90 k-ohms for reverse bias current flow.

7. A memory cell as defined in claim 6, wherein said diodes are Schottky barrier diodes with a leaky reverse bias characteristic which provides a resistance of at least 90 k-ohms for reverse bias current flow.

8. A memory cell as defined in claim 7, wherein each of said different diodes is disposed in a respective first current path between said first word line and the current-collecting terminal of said respective transistor; and further comprising means for providing a resistance in each of said respective first current paths.

9. A memory cell array as defined in claim 1 further comprising a first bit line, a first N type Schottky barrier diode for connecting said first bit line to the current-collecting terminals of one of said transistors;

a second bit line; and a second N type Schottky barrier diode for connecting said second bit line to the current-collecting terminal of the other of said transistors; and further comprising a resistor disposed between the cathode of each of said first and second Schottky barrier diodes and the current-collecting terminal of the associated said transistor.

10. A transistor memory cell array of the type wherein each of a plurality of memory cells includes data storage transistors connected to a given word line, each of the data storage transistors being driven into saturation thereby charging respective saturation capacitance when storing data, comprising a first word line;

a second word line;

a discharge line separate from said word lines;

each memory cell comprising two unclamped transistors with their current-emitting terminals coupled to said second word line and with the control terminal for each of said transistors coupled to the current-collecting terminal of the other transistor, with one of said transistors conducting in saturation to store data;

a pair of diodes, each having a cathode connected to said discharge line and an anode connected to the current-collecting terminal of a respective one of said transistors, each said diode discharging in its forward bias direction said transistor saturation capacitance prior to writing new data;

means for applying potentials to said discharge line to cause the conduction of current in the forward bias direction of said diodes prior to writing new data into each cell, and to cause non-conduction in the forward current direction of said diodes at other times; and means for applying potentials to said first and said second word lines to cause the writing of new data into each cell after said saturation capacitance discharging has occurred and said diodes are no longer conducting in their forward bias direction.

11. A memory cell array as defined in claim 10, wherein said current paths including said diodes further include a resistor.

12. A memory cell array as defined in claim 10, wherein said diodes are P type Schottky barrier diodes; and further comprising a first bit line;

a first N type Schottky barrier diode for connecting said first bit line to the current-collecting terminals of one of said transistors;

a second bit line; and a second N type Schottky barrier diode for connecting said second bit line to the current-collecting terminal of the other of said transistors.

13. A memory cell array as defined in claim 12 wherein said P type Schottky barrier diodes have a leaky reverse bias characteristics which provides a resistance of at least 90 k-ohms for reverse bias current flows.

14. A memory cell array as defined in claim 12 further comprising a resistor in each of said current paths.

15. A memory cell array as defined in claim 10 further comprising a resistor in each of said current paths.

16. A memory cell as defined in claim 10, including a separate load resistor connected between the current-collecting terminal of each said transistor and said first word line.

17. A memory cell array as defined in claim 10, wherein said first word line is connected directly to a power supply line.

18. A memory cell array as defined in claim 10 further comprising a first bit line;

a first N type Schottky barrier diode for connecting said first bit line to the current-collecting terminals of one of said transistors;

a second bit line; and a second N type Schottky barrier diode for connecting said second bit line to the current-collecting terminal of the other of said transistors; and further comprising a resistor disposed between the cathode of each of said first and second Schottky barrier diodes and the current-collecting terminal of said transistor associated therewith.

19. A memory cell array as defined in claim 10, wherein said P type Schottky barrier diodes have a leaky reverse bias characteristic which provides a resistance of at least 90 k-ohms for reverse bias current flows.

* * * * *